United States Patent [19]
Leupold

[11] Patent Number: 5,945,899
[45] Date of Patent: Aug. 31, 1999

[54] PERMANENT MAGNET TWISTER

[75] Inventor: Herbert A. Leupold, Eatontown, N.J.

[73] Assignee: The United States of America as represented by the Secretary of the Army, Washington, D.C.

[21] Appl. No.: 08/920,237

[22] Filed: Aug. 25, 1997

[51] Int. Cl.$^6$ .................................................. H01F 7/00
[52] U.S. Cl. ........................ 335/210; 335/302; 335/306; 372/2
[58] Field of Search ..................... 335/302–306, 335/210; 315/5.34, 5.35; 372/2; 250/396 ML

[56] References Cited

U.S. PATENT DOCUMENTS

| | | |
|---|---|---|
| 4,764,743 | 8/1988 | Leupold . |
| 4,906,877 | 3/1990 | Ciaio .......................................... 310/11 |
| 4,994,778 | 2/1991 | Leupold . |
| 5,099,217 | 3/1992 | Leupold . |

*Primary Examiner*—Michael L. Gellner
*Assistant Examiner*—Raymond Barrera
*Attorney, Agent, or Firm*—Michael Zelenka; George B. Tereschuk

[57] ABSTRACT

A permanent magnet rectangular bar shaped to form a helix having a central bore and a longitudinal axis. The magnetic orientation of the helical permanent magnet bar is along the longitudinal axis forming a transverse helical magnetic field. An electron beam or charged particle passing near the longitudinal axis experiences acceleration causing the charged particles to radiate creating a high energy radiation source. In another embodiment, first and second permanent magnet helical bars are intertwined together, forming a cylindrical tube, with each of the intertwined helical bars having a magnetic orientation along the longitudinal axis in opposing directions. In another embodiment of the present invention, an iron ribbon or other high permeability magnetic material is interposed between cut-out portions between first and second intertwined helical permanent magnet bars. This effectively augments the transverse magnetic field. A relatively compact permanent magnetic structure that is relatively simple having a desired transverse helical magnetic field is made possible for such applications as free electron lasers or millimeter/microwave radar devices.

13 Claims, 4 Drawing Sheets

PERMANENT MAGNET TWISTER

RELATED APPLICATION

"A Chrion Twister" which has been partially assigned to the same assignee, has been filed in the United States Patent and Trademark Office and is related to this application.

GOVERNMENT INTEREST

The invention described herein may be manufactured, used, and licensed by and for the government of the United States of America for governmental purposes without the payment to me of any royalty hereon.

FIELD OF THE INVENTION

The present invention relates in general to a permanent magnet structure used as a twister and more particularly to a permanent magnet structure, creating a magnetic field that causes an electron to have a helical trajectory.

BACKGROUND OF THE INVENTION

In many devices such as radar, free electron lasers, and other high energy radiation sources such as high powered millimeter or microwave devices, there is a need for providing a helically oriented transverse magnetic field. Such permanent magnetic devices are known, for example, the permanent magnetic structure disclosed in U.S. Pat. No. 4,764,743 entitled "Permanent Magnet Structures For The Production Of Transverse Helical Fields" issuing to Leupold et al on Aug. 16, 1988, which is herein incorporated by reference. Therein disclosed is a permanent magnet structure formed from a multiplicity of permanent magnet segments, with the segments displaced radially from each other progressively along the longitudinal axis. Another permanent magnet structure is disclosed in U.S. Pat. No. 4,994,778 entitled "Adjustable Twister" issuing to Leupold on Feb. 19, 1991, which is herein incorporated by reference. Therein disclosed is a permanent magnet structure comprising a linear array of hollow cylindrical flux source structures nested one within another about a common central axis and free to rotate about the axis providing a periodic magnetic structure suitable for use as a helical wiggler or a twister. Another permanent magnet structure is disclosed in U.S. Pat. No. 5,099,217 entitled "Constant Gap Cladded Twister" and issuing to Leupold on Mar. 24, 1992, which is herein incorporated by reference. Therein disclosed is a cladded magnet twister with each segment being displaced radially in equal angular segments along the central axis having a plurality of cladding magnets and opposing pole pieces having convex faces which are directed inward toward one another. While these prior permanent magnet structures produce a desired magnetic field within their central working space, they all have a relatively complex permanent magnet structure with a multitude of different magnets. Therefore, there is a need for a simpler permanent magnet structure having less volume and weight that produces a desirable transverse helical magnetic field.

SUMMARY OF THE INVENTION

The present invention, in one embodiment, comprises a permanent magnet bar shaped to form a helix and having a central bore or working space with a longitudinal axis. The permanent magnet helical bar is magnetized with a magnetic orientation substantially parallel to the longitudinal axis. Additionally, the longitudinal or axial thickness of the bar is substantially equal to the longitudinal or axial spacing distance between the helical coils of the permanent magnet bar. A desirable transverse helical magnetic field is thereby formed within the bore or working space of the permanent magnet structure. In another embodiment of the present invention, a second permanent magnet helical bar is intertwined with a first permanent magnet helical bar such that the longitudinal magnetic orientation of each of the helical bars is opposite to each other, thereby increasing the transverse magnetic field and resulting power output of the device. In a third embodiment of the present invention, a high permeability magnetic material, such as iron, is intertwined between a first intertwined helical bar and a second intertwined helical bar, thereby augmenting the transverse magnetic field on axis.

Accordingly, it is an object of the present invention to form a desirable transverse helical magnetic field in a central working space or bore.

It is an advantage of the present invention that it is a relatively simple structure that is easy to manufacture and of a compact size and weight.

It is a feature of the present invention that one or more permanent magnet helical bars are used.

It is another feature of the present invention that a helical iron bar can be placed between adjacent coils of the helical permanent magnet.

These and other objects, advantages, and features will become readily apparent in view of the following detailed description.

DETAILED DESCRIPTION OF THE PREFERRED EMBODIMENTS

Figure 1A:
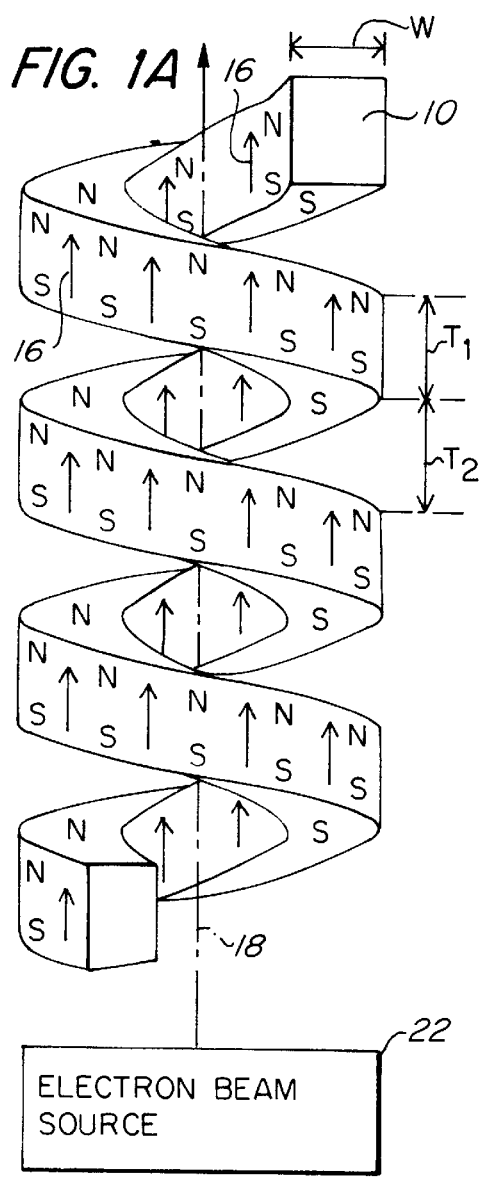
FIG. 1A is a perspective view of the present invention.
Figure 1C:
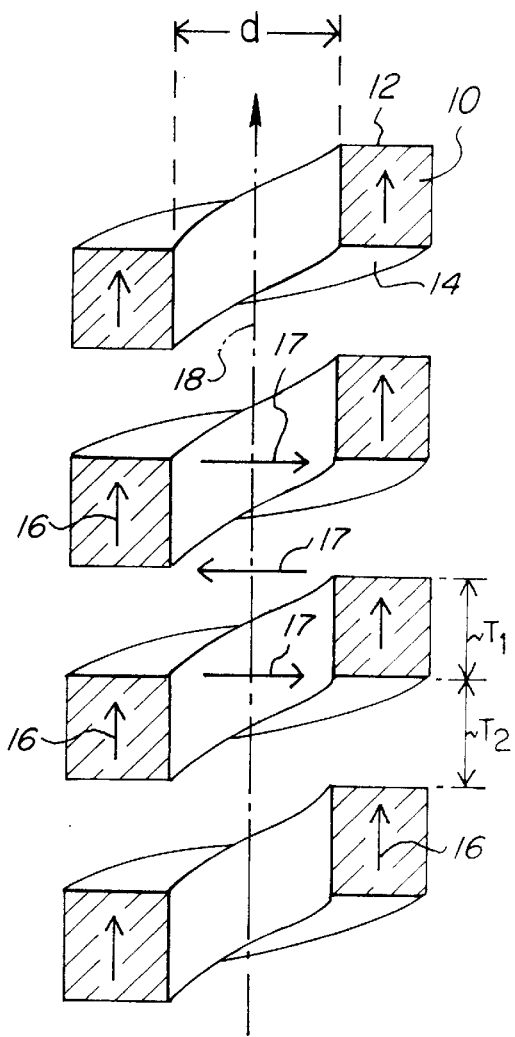
FIG. 1C is a cross section taken along line 1C—1C in FIG. 1B.
Figure 1B:
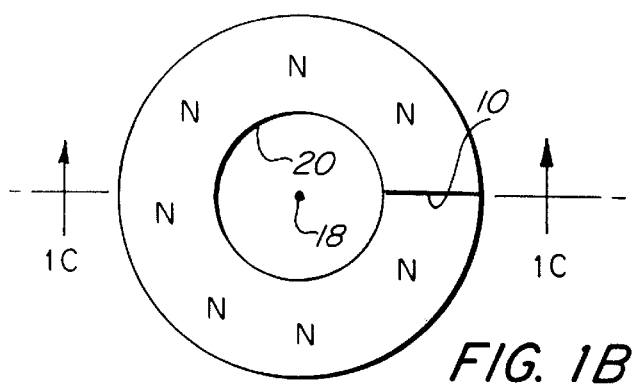
FIG. 1B is a top plan view of the embodiment illustrated in FIG. 1A.

FIGS. 1A, 1B, and 1C illustrate a first embodiment of the simplest form of the present invention. FIG. 1A illustrates a helical bar that has a substantially rectangular cross section. The helical bar 10 may be manufactured by any conventional means. For example, a high cohesive permanent magnet in the form of a cylinder or pipe that is magnetized in the longitudinal or axial direction could be cut so as to form the helical bar 10. Accordingly, the helical bar 10 may be made from any high cohesive permanent magnet material of high coercivity, i.e. higher than its remanance measured in Gaussian units. The helical bar 10 has a top surface 12 and a bottom surface 14. The helical bar 10 is magnetized in the axial direction illustrated by arrows 16, such that magnetic north is on the top surface 12 and magnetic south is on the bottom surface 14. The helical bar 10 is formed around a central axis 18 along which an electron beam may be projected from electron beam source 22. The helical bar 10 has a radial width W, and an axial thickness $T_1$ between the top surface 12 and the bottom surface 14. The spacing between adjacent coils of the helical bar is indicated as $T_2$. The preferred structure is such that the axial thickness $T_1$ is equal to the coil spacing $T_2$. As in FIG's 1 and 5 there will only be a radial component of the field on axis where the beam action takes place. Accordingly, the axial thickness $T_1$ is that distance along the helical axis in one-half turn of a coil. In this way, the north pole charge distribution is always diametrically opposed to the south pole distribution so that the transverse field at the central axis 18 is maximized. In that way there will be only be a radial component of the field on axis where the beam action takes place. Off-axis there will be an axial component as well which helps focus the beam to keep it on or near the axis 18. It should be noted that the axial spacing between the north and south pole surfaces should be substantially greater than the bore diameter. Otherwise, much, or in extreme cases most of the flux will pass between adjacent polar surfaces rather than transversely across the bore. The magnetic field has axial components at points that are not on axis 18. The transverse component of the magnetic field imparts a circular motion to the electron beam or charged particles, which, when added vectorially to the axial translational motion, results in a helical trajectory. The motion having a rotary component, therefore involves acceleration which causes the charged particle to radiate. If the magnetic field, B, is such that its product with the period $(T_1+T_2)$ is approximately equal to unity, or 1, when B is measured in Telsa's and $(T_1+T_2)$ is measured in centimeters, laser action may form coherent radiation from all parts of the beam forming a power source of circularly polarized radiation. The magnetic fields produced according to the structure of this first embodiment compare favorably to those of other, much more complicated structures. The magnitude of the magnetic field in the working space or bore may be increased by increasing the radial width W. However, this will add mass or weight to the structure and quickly becomes ineffective if the width becomes much greater than the distance between successive windings. The present invention can produce a relatively large field, in the order of 1800 Oe, in a smaller structure with less assembled parts than is conventionally possible. FIG. 1B is a top plan view illustrating the helical bar 10 and the bore 20 formed thereby. FIG. 1C is a cross section taken along line 1C—1C in FIG. 1B, more clearly illustrating the rectangular structure of the helical bar 10. FIG. 1C also more clearly illustrates that the north pole charge distribution is preferably diametrically opposed to the south pole distribution so that the transverse field at the central axis 18 is maximized and in a diametric direction. Arrows 17 illustrate the general direction of the magnetic field created within the bore formed by the helical bar 10. It should be appreciated that for convenience of illustration the bore formed by the helical bar 10 has a relatively large diameter d with respect to the adjacent coil spacing $T_2$. However, in an actual or preferred device the diameter of the bore d will be substantially less than the adjacent coil spacing $T_2$. Accordingly, a desired relatively strong transverse magnetic field, illustrated by arrows 17, will be created and dominate rather than a longitudinal magnetic field between adjacent coils.

Figure 2A:
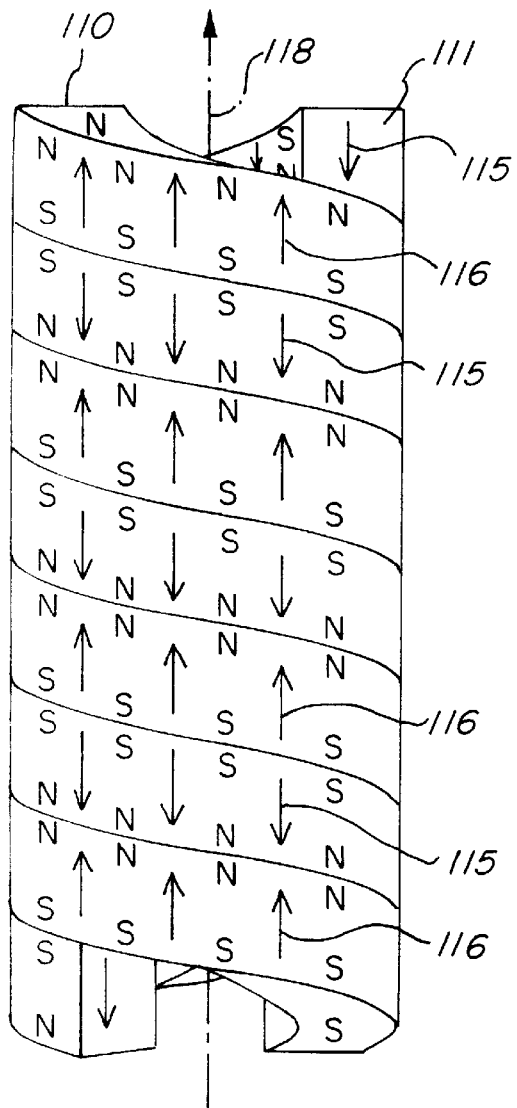
FIG. 2A is a perspective view illustrating a second embodiment of the present invention.
Figure 2B:
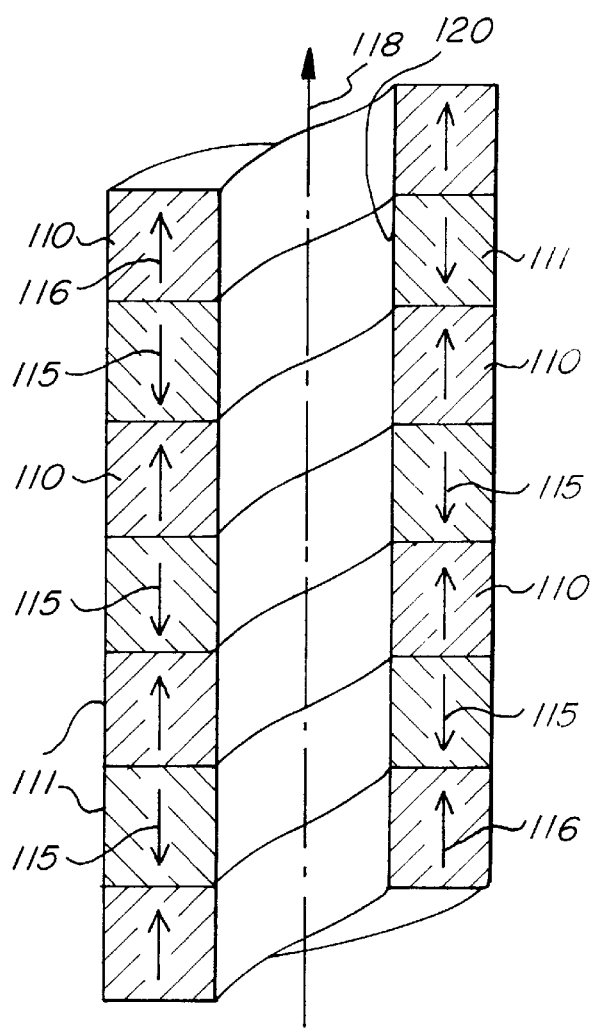
FIG. 2B is a cross section view of the second embodiment illustrated in FIG. 2A.

FIGS. 2A and 2B illustrate a second embodiment of the present invention having a first helical permanent magnet bar 110 and a second helical permanent magnet bar 111 intertwined to form a cylindrical tube or pipe. The cylindrical tube or pipe is preferably a right cylinder. The first helical bar 110 has a magnetic orientation represented by arrows 116 that is opposite or opposed to the magnetic orientation represented by arrows 115 of the second helical bar 111. Preferably, the longitudinal or axial thickness of the first helical bar 110 is equal to the longitudinal or axial thickness of the second helical bar 111. A central working space or bore is formed within the intertwined first and second helical bar permanent magnets 110 and 111. The bore has a longitudinal axis 118. FIG. 2B is an axial cross section of FIG. 2A, which more clearly illustrates the magnetic orientation of adjacent coil portions of the first and second helical bars 110 and 111. The use of a first permanent magnet helical bar 110 and a second permanent magnet helical bar 111, having opposing magnetic orientations along a longitudinal axis, effectively doubles the pole density at each layer between adjacent coils, thereby doubling the transverse magnetic field. Accordingly, an electron beam traveling along or parallel to the longitudinal axis 118 is subject to twice the acceleration compared to the use of only one helical bar of the first embodiment of the present invention, illustrated in FIGS. 1A–1C. Since the power of a free electron laser varies as the square of the accelerating field that causes the electron to follow a helical path, the power output of such a device would be quadruple that of a single helical bar free electron laser or twister formed according to the first embodiment, illustrated in FIGS. 1A–1C. The second embodiment provides a stronger transverse magnetic field in a compact space.

Figure 3:
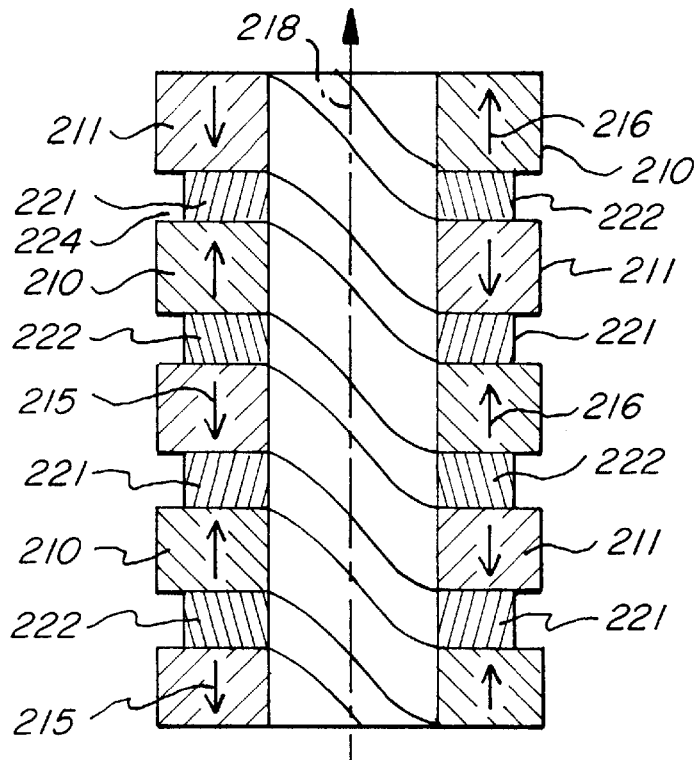
FIG. 3 schematically illustrates a third embodiment of the present invention.
Figure 4:
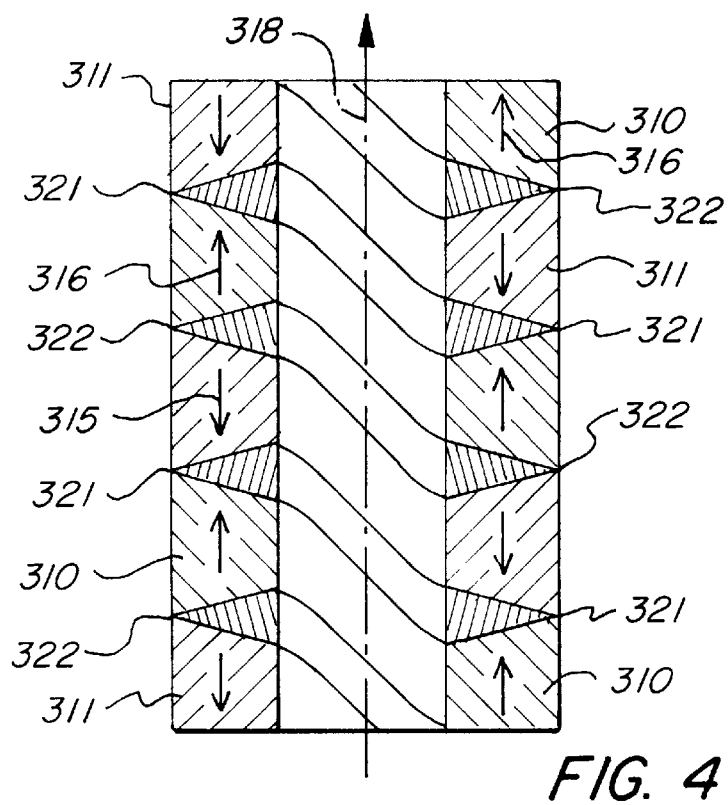
FIG. 4 schematically illustrates a fourth embodiment of the present invention.

FIGS. 3 and 4 illustrate embodiments that use iron or other high permeability magnetic material placed between the adjacent first and second helical bars 111 and 110, illustrated in FIGS. 2A–2B. This results in the transverse magnetic field on axis to be augmented because of the easy magnetic flux path afforded through the iron or other high permeability magnetic material. In FIG. 3, a first permanent magnet helical bar 210 having a magnetic orientation, illustrated by arrows 216, parallel to the longitudinal axis 218, is intertwined with a second permanent magnet helical bar 211, having a magnetic orientation illustrated by arrows 215, in a direction opposite or opposed to that of the first helical permanent magnet bar 210. Helical bars of iron or other high permeability magnetic material are intertwined between carved out portions of the adjacent first and second helical intertwined bars 210 and 211. A helical iron bar is placed between each surface of the first and second helical intertwined bars 210 and 211. Therefore, there are two helical iron bars 221 and 222 placed between the boundary of the first and second helical bars 210 and 211, with iron bar 221 forming a north pole and iron bar 222 forming a south pole. However, the iron bar also has the detrimental effect of allowing additional magnetic flux leakage to the outside of the permanent magnet structure. To reduce the magnetic flux leakage, the iron bars 221 and 222 can be shortened or indented on the outside so that flux passage across the interior working space or bore is favored. Therefore, the iron bars 221 and 222 extend a radial distance outward less than that of the exterior surface of the intertwined permanent magnet bars 210 and 211.

FIG. 4 illustrates another embodiment having intertwined permanent magnet helical bars 310 and 311 with respective opposing magnetic orientations illustrated by arrows 316 and 315. The permanent magnet helical bars 310 and 311 have a trapezoidal cross section. A central working space or bore having a longitudinal axis 318 is thereby formed. Intertwined between the first helical permanent magnet bar 310 and the second helical permanent magnet bar 311 are first and second iron helical ribbons 321 and 322. The helical 321 and 322 have a triangular cross section. The triangular cross section of the intertwined helical iron 321 and 322 has a base adjacent the interior surface and a vertex adjacent the exterior surface. This facilitates magnetic flux flow in the interior and restricts magnetic flux flow on the outside or external surface of the permanent magnet structure. The use of helical iron bars illustrated in FIG. 3 or FIG. 4 results in a significant increase in magnetic field or a sizable reduction in size for a constant magnetic field, both of which have great advantage in airborne or ballistic vehicles where lightweight and close packing are a necessity. It should be appreciated that while the iron material 221, 222, 321, and 322 has been described as an iron bar or ribbon, the iron or other high permeability magnetic material could take other forms, such as being formed by an initially fluid state that is permitted to flow between the adjacent coils.

Figure 5:
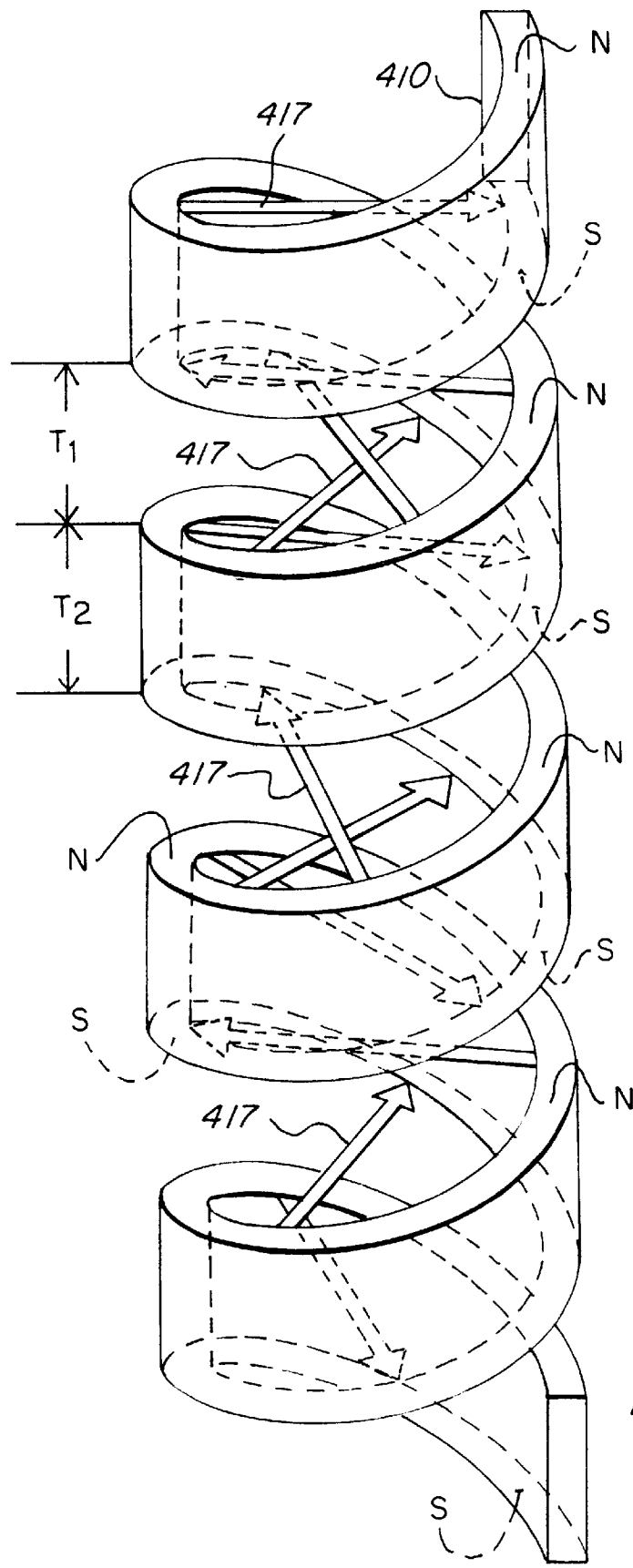
FIG. 5 is a perspective view of an embodiment similar to the embodiment of FIG. 1 illustrating the resultant magnetic field.

FIG. 5 is a perspective view more clearly illustrating the magnetic field created by a helical magnet structure of FIG. 1. Permanent magnet helical bar 410 is illustrated in FIG. 5. The helical bar 410 has a north pole surface N and a south pole surface S. As in FIG. 1, the helical bar 410 has an axial thickness of $T_1$ and spacing between adjacent coils of $T_2$. A transverse magnetic field is created within the bore formed by the helical bar 410. The transverse magnetic field spirals or rotates as it progresses along the longitudinal axis of the helical bar 410. Arrows 417 illustrate the transverse magnetic field rotating around the longitudinal axis of the helical bar 410. In this figure, FIG. 5, the heads of the arrows 417 point to the south pole surface S, and the tails of the arrows 417 point to the north pole surface N. The transverse rotating magnetic field is formed between transversely diametrically opposed north pole surfaces N and south pole surfaces S of the helical bar 410. Accordingly, the magnetic field will have a radial component and an axial component perpendicular thereto.

Accordingly, the present invention, in using a permanent magnet helical bar produces a working space having a relatively strong helically oriented transverse magnetic field or flux in a relatively compact and easily manufactured shape. As a result, efficient and powerful millimeter and microwave sources can be made resulting in the manufacture of smaller and more powerful devices. Additionally, while several embodiments have been illustrated and described, it will be obvious to those skilled in the art that various modifications may be made without departing from the spirit and scope of this invention.

What is claimed is:

1. A permanent magnet twister, comprising:
    a permanent magnet bar shaped in the form of a helix, said permanent magnet bar having a central bore, a longitudinal axis, and a magnetic orientation in a direction along said longitudinal axis;
    an electron beam source, said electron beam source directing electrons near said longitudinal axis;
    said permanent magnet bar has a rectangular cross section having an axial thickness along said longitudinal axis;
    said permanent magnet bar having a plurality of coils, each of said plurality of coils spaced from each other a distance equal to the axial thickness of said permanent magnet bar;
    wherein a transverse helical magnetic field is formed within the central bore causing an electron traveling near said longitudinal axis to have acceleration causing said electron to radiate.

2. A permanent magnet twister comprising:
    a first permanent magnet bar, said first permanent magnet bar shaped in the form of a helix having a first central bore and a first longitudinal axis, said first permanent magnet bar having a first magnetic orientation in a first direction along the first longitudinal axis; and
    a second permanent magnet bar, said second permanent magnet bar shaped in the form of a helix having a second central bore and a second longitudinal axis, said second permanent magnet bar having a second magnetic orientation in a second direction along the second longitudinal axis, said first permanent magnet bar and said second permanent magnet bar being intertwined forming a cylinder,
    wherein a transverse helical magnetic field is formed within the first and second central bore causing a charged particle traveling near the first and second longitudinal axis to have acceleration causing the charged particle to radiate.

3. A permanent magnet twister as in claim 2 wherein:
    the first magnetic orientation and the second magnetic orientation have opposing directions.

4. A permanent magnet twister as in claim 2 wherein:
    said first permanent magnet bar has a rectangular cross section having a first axial thickness along the first longitudinal axis; and
    said second permanent magnet bar has a rectangular cross section having a second axial thickness along the second longitudinal axis.

5. A permanent magnet twister as in claim 4 wherein:
    said first permanent magnet bar shaped in the form of a helix has a first plurality of coils, each of said first plurality of coils spaced from each other a distance equal to the first axial thickness;
    said second permanent magnet bar shaped in the form of a helix has a second plurality of coils, each of said second plurality of coils spaced from each other a distance equal to the second axial thickness, said first axial thickness being equal to said second axial thickness; and
    said first magnetic orientation of the first permanent magnet bar and said second magnetic orientation of the second permanent magnet bar having opposing directions.

6. A permanent magnet twister as in claim 4 wherein:
    the cylinder is a right cylinder.

7. A permanent magnet twister comprising:
    a first permanent magnet bar, said first permanent magnet bar shaped in the form of a helix having a first central bore and a first longitudinal axis, said first permanent magnet bar having a first magnetic orientation in a first direction along the first longitudinal axis;
    a second permanent magnet bar, said second permanent magnet bar shaped in the form of a helix having a second central bore and a second longitudinal axis, said second permanent magnet bar having a second magnetic orientation in a second direction along the second longitudinal axis, said first permanent magnet bar and said second permanent magnet bar being intertwined forming a cylinder having an exterior surface, the first magnetic orientation and the second magnetic orientation have opposing directions; and
    two bars of a high permeability magnetic material placed between a boundary of said first and second permanent magnet bars, each of said two bars of said high permeability magnetic material being shaped in the form of a helix,
    wherein a transverse helical magnetic field is formed within the first and second central bore causing a charged particle traveling near the first and second longitudinal axis to have acceleration causing the charged particle to radiate.

8. A permanent magnet twister as in claim 7 wherein:

said high permeability magnetic material has a rectangular cross section and extends a radial distance outward less than that of the exterior surface of the cylinder.

9. A permanent magnet twister as in claim 7 wherein:

said high permeability magnetic material has a triangular cross section having a vertex.

10. A permanent magnet twister as in claim 9, wherein:

the vertex of said high permeability magnetic material points to the exterior surface of the cylinder.

11. A permanent magnet twister as in claim 7 wherein:

said high permeability magnetic material is iron.

12. A permanent magnet structure for guiding a charged particle, comprising:

a helical permanent magnet having a plurality of coils and a hollow central bore with a longitudinal axis;

each of said plurality of coils being spaced from each other a first distance equal to the axial thickness of said permanent magnet bar;

a charged particle source, said charged particle source directing a charged particle near said longitudinal axis;

said helical permanent magnet having a magnetic orientation parallel to the longitudinal axis such that a north pole is formed on a first surface having a plane perpendicular to the longitudinal axis and a south pole is formed on a second surface having a plane perpendicular to the longitudinal axis, whereby a spiraling transverse magnetic field is created between transversely diametrically opposed north and south poles; and said spiraling transverse magnetic field causing said charged particle travelling near said longitudinal axis to have acceleration causing said charged particle to spiral.

13. A permanent magnet structure as in claim 12 wherein:

a second distance in a longitudinal direction between the first surface and the second surface is greater than a diameter of the hollow central bore.

* * * * *